United States Patent [19]

Cohen

[11] 3,864,721

[45] Feb. 4, 1975

[54] TUNNELING ELECTROLUMINESCENT DIODE WITH VOLTAGE VARIABLE WAVELENGTH OUTPUT

[75] Inventor: Marvin M. Cohen, Rochville, Md.

[73] Assignee: The United States of America as represented by the Secretary of the Army, Washington, D.C.

[22] Filed: June 18, 1973

[21] Appl. No.: 371,334

[52] U.S. Cl. .................... 357/17, 357/12, 357/63, 357/64, 357/61

[51] Int. Cl. .................... H05b 33/00

[58] Field of Search .. 317/235 N, 235 AC, 235 AQ; 357/17, 63, 64

[56] References Cited

UNITED STATES PATENTS

| | | | |
|---|---|---|---|
| 3,390,311 | 6/1968 | Aven | 317/237 |
| 3,603,833 | 9/1971 | Logan | 313/108 D |
| 3,673,064 | 6/1972 | Blakeslee | 240/147 |

*Primary Examiner*—Martin H. Edlow
*Attorney, Agent, or Firm*—Nathan Edelberg; Robert P. Gibson; Saul Elbaum

[57] ABSTRACT

An electroluminescent diode which allows for variation of output wavelength with diode bias voltage. The diode utilizes a tunneling P-N junction wherein electrons tunnel from the N-type material to the P-type material wherein there are located several impurities. By proper application of a particular bias voltage the electrons will tunnel from impurity levels within the N-type material to impurity levels within the P-type material. Optical radiation is produced by de-excitation of the tunnel electrons from a higher impurity level to a lower impurity level or valence energy level. The N-type material is built with but one impurity dopant. A particular optical wavelength output is selected by applying a selected bias voltage to the P-N junction such that the impurity energy level within the N-type material is equivalent to the energy level within the P-type material desired to be tunneled to. Upon tunneling to an energy level within the P-type material, these electrons de-excite and in the process thereof emit radiation corresponding to the difference in the energy levels of the transition. The P-type material is comprised of gallium arsenide having a dopant consisting of chromium and copper. The N-type material dopant is tellurium. The P-N junction is formed by alloying tellurium to gallium arsenide. The impurity density of the N-type material is twice that of the impurity densities within the P-type material.

3 Claims, 5 Drawing Figures

TUNNELING ELECTROLUMINESCENT DIODE WITH VOLTAGE VARIABLE WAVELENGTH OUTPUT

RIGHTS OF THE GOVERNMENT

The invention described herein may be manufactured, used, and licensed by or for the U.S. Government for governmental purposes without the payment to the inventor of any royalty thereon.

BACKGROUND OF THE INVENTION

Heretofore there was no electroluminsecent diode which allowed for the variation of output wavelength with diode voltage. Moreover heretofore there was no electroluminescent diode utilizing tunneling phenomena between impurity levels as the mechanism for electron supply to the radiation-recombination region. In other designs of electroluminescent diodes, for tunneling injection to radiated recombinations states, electrons are assumed to tunnel through the junction to a conduction band tail on the P side of the compensated diode. In this structure only one impurity dopant is utilized. The density distribution of impurity tail states is approximated to be exponential. Luminescence occurs only if the dynamic balance between the voltage-dependent tunneling rate and the radiated recombination rate is satisfied such that the low energy tail states are saturated.

It is therefore an object of this invention to provide a new and novel tunneling electroluminescent diode with voltage variable wavelength output capable of emitting radiant optical energy at several distinct wavelengths.

It is another object of this invention to provide a new and novel tunneling electroluminescent diode which utilizes tunneling phenomena between impurity levels as a mechanism for electron supply. It is yet another additional object of this invention to provide an electroluminescent diode which emits radiant optical energy at several distinct wavelengths as a function of the bias voltage across the diode.

Still another additional object of this invention is to provide a new tunneling electroluminescent diode which selectively emits several wavelengths of radiant optical energy, each wavelength having a narrow bandwidth without the necessity for band filling.

These and other objects of the present invention will become more fully apparent with reference to the following specifications and drawings which relate to several variations of a preferred embodiment of the present invention.

SUMMARY

In accordance with this invention a new and novel electroluminescent diode which allows for the variation of output wavelength of the optical radiation emitted therefrom as a function of the diode biasing voltage is provided. The mechanism for emission of the electroluminescent radiation is provided by tunneling of electrons between impurity levels. In this particular diode, radiation is furnished by de-excitation of electrons tunneling from an N-type material to a corresponding energy band in a P-type material. The electromagnetic radiation emitted has a wavelength smaller than the energy of the band gap of the host material. Several energy levels which may be tunneled to are provided within the P-type material. The energy levels to which the supply electrons tunnel is selected by adjusting the voltage level of the bias. Therefore, by selecting a particular biasing voltage, the supply electrons tunnel to a selected band within the P-type host material and, as a consequence, emit radiation of a particular wavelength. The impurities used for the P-type material are chromium and copper. The energy levels developed in the P-type material permit narrow band emission.

BRIEF DESCRIPTION OF THE DRAWINGS

The specific nature of the invention as well as other objects, aspects, uses, and advantages thereof will clearly appear from the following description and the accompanying drawings in which.

DESCRIPTION OF THE PREFERRED EMBODIMENT

Figure 1:
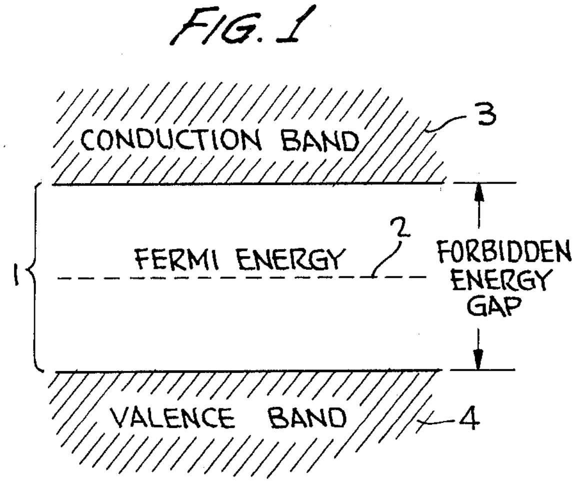
FIG. 1 is an energy diagram for the host material showing a wide band gap.

Referring now to FIG. 1 there is depicted an energy diagram of a large band gap material such as boron phosphide. Boron phosphide is not to be construed to limit this disclosure but is merely presented as an example. Shown therein is a conduction band region 3, a valence band region 4, separation energy of said regions three and four being illustrated as energy gap, and Fermi energy level 2. The large band gap material depicted in FIG. 1 is first doped with several different types of P-type impurities each to have a concentration of approximately $10^{19}$ parts per cubic centimeter. Hence, the band diagram depicted in FIG. 1 is altered such that it now appears as that shown in FIG. 2.

Figure 2:
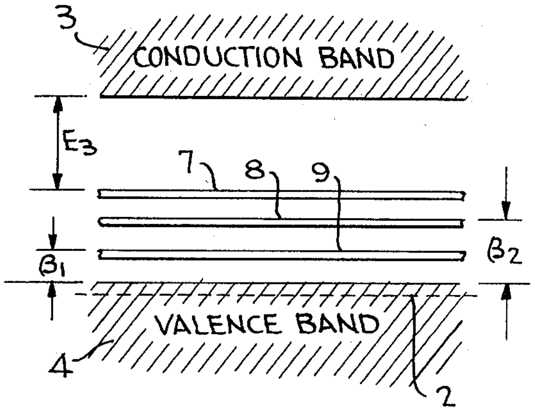
FIG. 2 is a diagram of the energy level within the host material as a result of the introduction of P-type impurities.

In FIG. 2 again the conduction band region 3 and the valence band region 4 are depicted. Moreover, because of the introduction of three impurities, band levels 7, 8 and 9 are produced and the Fermi energy level 2 is shifted to within the valence band region 4. Also shown in FIG. 2 are $B_1$, $B_2$ and $E_3$. These represent the energy of the impurity energy bands of the three P-type of the impurities 7, 8 and 9 introduced into the host crystal. Specifically, $E_3$ represents the distance of the upper most energy band 7 from the conduction band 3, $B_1$ represents the energy difference between the lower most energy band 9 and the valence band region 4, and $B_2$ represents the energy difference between impurity energy band level 8 and the valence band region 4. Impurities are chosen such that the impurity bands do not overlap.

Figure 3:
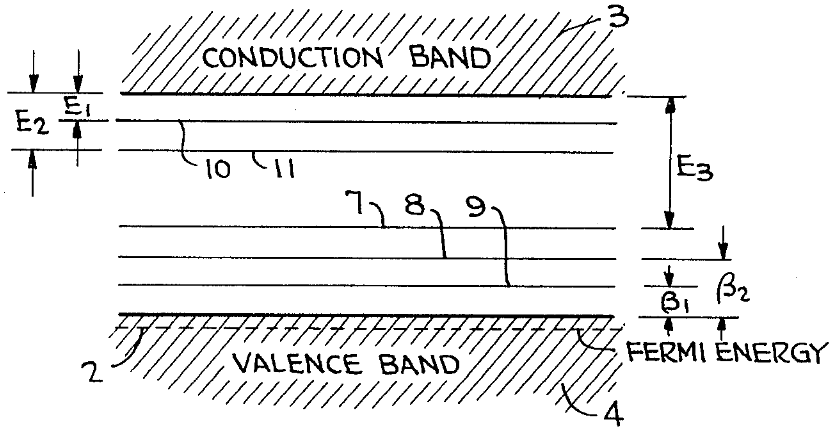
FIG. 3 is a diagram of the energy levels of the host material showing the energy levels resulting from an introduction of both P-type and N-type impurities.

In order to more easily later produce a distinct N-type region two of the P-type impurities are fully compensated with two N-type impurities each having a concentration density of $10^{19}$ parts per cubic centimeter. The energy band diagram for the complete crystal structure with these impurities added is changed and is depicted in FIG. 3. Hence, FIG. 3 shows the addition of energy bands as represented by $E_1$ and $E_2$. $E_1$ and $E_2$ representing the energy difference of the energy bands

10 and 11 from the conduction band 3 as produced by introduction of two N-type impurities. Note, the Fermi level 2 is distinctly within the valence band region 4. The reason for this is that the material is still degenerately doped P-type due to the uncompensated $10^{19}$ parts per cubic centimeter of P-type impurities.

The P-N junction is produced by diffusion, alloying, or ion implantation. The N-type region is a product of the introduction of one more N-type impurities at energy $E_4$ to a density of approximately $2 \times 10^{19}$ parts per cubic centimeter into the host crystal. The band diagram of the entire structure is illustrated in FIG. 4.

Figure 4:
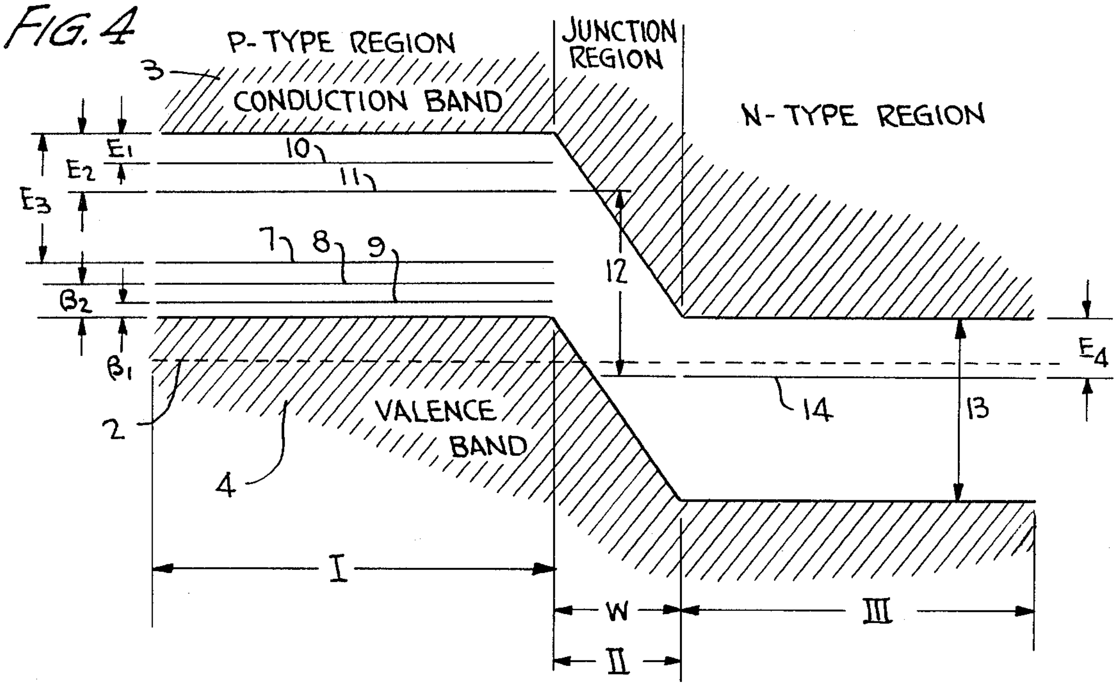
FIG. 4 is an energy band diagram of the P-N junction.

In FIG. 4, region I represents the P-type region, region II represents the junction and region III represents the N-type region. Also, the difference in energy 12 between the energy band level of the N-type impurity introduced into the N-type region and the lower most energy band level introduced into the P-type region as a result of an N-type impurity is representative of the minimum bias in terms of electron volts necessary to initiate tunneling which will yield electroluminescence. Therefore, this energy value may be represented as $q \times$ Vo; or alternatively, Vo (the bias voltage) is equal to the energy difference 12 divided by the electron charge value (all units being rationalized). The separation 13 represents the energy gap of the N-type region.

The Fermi energy on the N side or region III lies above the chosen impurity energy level E4. Energy difference 13 is the width of the energy gap, Eg, in energy units and region II has a physical dimensional width W. This dimensional width W is a specific width of the P-N junction which for impurity densities set forth in this specification is of the order of several hundred angstroms. This particular dimensional limitation of the P-N junction width is thin enough to allow for tunneling.

Statistically, the level $E_4$ is filled with electrons (it is well below the Fermi level), and the levels $B_1$, $B_2$, $E_1$, $E_2$, $E_3$ are depleted of electrons (these levels are above the Fermi level).

Figure 5:
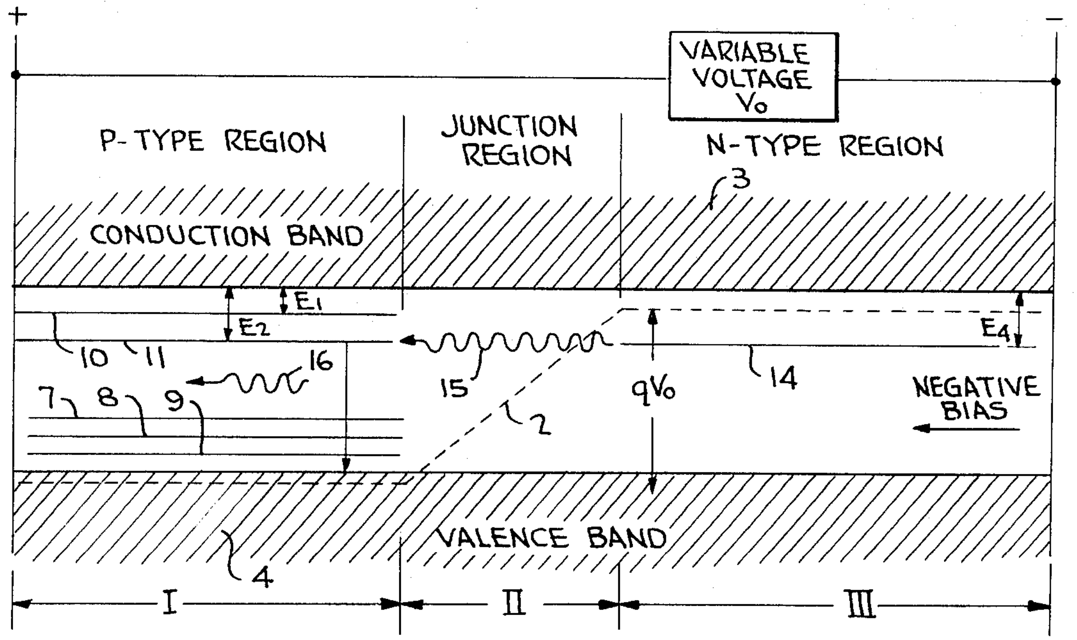
FIG. 5 is an energy band diagram of the instance invention showing the mechanism by which electrons are supplied for radiant emission.

Applying a forward bias Vo to the P-N junction moves all the energy levels in region III up in energy a distance, as indicated by FIG. 5, equal to the electronic unit charge, $q$, for an electron times the value of the bias voltage Vo. So long as this bias is maintained these energy levels maintain their positions relative to one another. In addition, each level in region III remains stationary.

In FIG. 5 the specific value of voltage bias Vo, the energy band level E4 corresponds to energy level 11. Therefore, FIG. 5 is a case in which the applied biased voltage is such that energy band level $E_2$ region II is made equivalent in energy to energy band level $E_4$. In this particular situation, electrons 15 tunnel from the filled energy band level $E_4$ across the junction region II to the unfilled energy band level $E_2$ as shown by wave 15 within FIG. 15. These electrons after tunneling to energy band level $E_2$ in region I, comprising the P-type material, de-excite to the energy band level of the valence band 4 of region I. As depicted by wave 16 in this recombination process, energy is emitted and exits the diode as radiant energy.

In recombination these electrons lose an amount of energy as follows:

$$E_{lost} = E_g - E_2.$$

This energy is emitted from the diode as multiple quantums of radiant energy expressed physically as follows:

$$^{hc}f = E_g - E_2$$

The wavelength λ of the emitted radiation is given by the equation as represented by the following symbols:

$$[E_g - E_2/\text{hc}]^{-1}$$

(c is the velocity of light and h is Planck's constant).

In FIG. 5 application of a still larger bias voltage Vo brings the energy level $E_4$ to the same energy level as the energy band level $E_1$. As a consequence of this increase in bias voltage Vo it becomes energetically possible to tunnel to the energy band level $E_1$.

It must be noted, that with this fabrication process the levels $B_1$, $B_2$, $E_3$, $E_1$ and $E_2$ still exist in region I, comprised of the N-type material having N-type impurities therein. Therefore, when these levels are opposite the energy band levels in region III of the junction, electrons will also tunnel to the corresponding levels as above specified. Hence, the total radiant emission from the diode will be made up of the sum of the intensities at the wavelengths of all probable emissions.

A typical construction of the present invention as presented herein involves the use of gallium arsenide as the host crystal. Gallium arsenide has a band energy gap of 1.47 electron volts. Region I having the characteristic of a P-type material is formed by doping the host crystal with copper whereby said element is deposited therein. This impurity produces energy levels above the valence band at the specific energies of 0.0.23 electron volts, 0.15 electron volts, 0.24 electron volts, and 0.51 electron volts. A much higher energy band level is formed in the P-type region I by introduction of the element chromium. Chromium produces an energy band level 0.73 electron volts above the valence band of gallium arsenide. The Concentration level for both the copper and chromium impurities is approximately $10^{19}$ parts per cubic centimeter.

The N-type region III for gallium arsenide, the hole crystal, is produced for this specific embodiment by the alloying tellurium therein, a naturam element having N-type characteristics. Tellurium produces an energy band level 0.003 electron volts below the conduction band edge. The Fermi level for the P-N junction formed as a result of this alloying process for introduction of tellurium into gallium arsenide is 0.02 electron volts. Other permissible compensatory N-type dopants include selenium and stibium.

Applying a forward bias to a diode made according to the specification above produces tunneling at the voltage equivalent to 0.046 electron volts divided by the electronic charge of a electron, where 0.046 electron volts is the sum of the fermi energy levels 0.02 and the first energy band level as introduced into the P-type material region I and is specifically 0.023 electron volts. Tunneling also occurs at the voltage equivalent to the energy levels 0.17 electron volts, 0.26 electron volts, 0.53 electron volts, and 0.75 electron volts. Note, the device described herein produces these emissions a discrete frequencies which are dependent upon the impurity dopants. Whereas the voltage is continuously varied the optical emissions are not continuously varied, but discretely varied from one isolated wavelength to another.

It is to be understood that the inventor does not desire to be limited to the exact details of construction shown and described, for obvious modifications will occur to a person skilled in this art.

What is claimed is:

1. A light emitting tunnel diode comprising a semiconductive body having a first region of P-type conductivity and a second region of N-type conductivity which forms a junction with said first region wherein the impurity concentration in said N-type region is twice that in said P-type region and the width of said junction is several hundred angstrom units to facilitate tunneling, said first region having a plurality of different P-type impurities therein which create a plurality of different electron-devoid P-type impurity energy levels and a lesser number of N-type impurities therein which create a lesser number of electron-devoid N-type impurity levels, said N-type region having a single N-type impurity therein which creates a single electron-filled N-type impurity energy level beneath said energy levels in said P-type region, said junction is forward biased to raise said single N-type energy level equal to the energy of any of said impurity levels in said P-type region whereby electrons tunnel cross said junction from said N-type to said P-type region.

2. The diode of claim 1 wherein said body is made of gallium arsenide and said plurality of P-type impurities are copper and chromium which have a concentration of approximately $10^{19}$ per $cm^3$.

3. The diode of claim 2 wherein said N-type impurities in said P-type region are selected from the group consisting of selenium, stibium, and tellurium.

* * * * *